United States Patent
Han et al.

(10) Patent No.: US 7,471,158 B2
(45) Date of Patent: Dec. 30, 2008

(54) AUTOMATIC SWITCHING PHASE-LOCKED LOOP

(75) Inventors: Song-Rong Han, Taipei County (TW); Ming-Shih Yu, Taipei County (TW)

(73) Assignee: Faraday Technology Corp., Hsin-Chu (TW)

( * ) Notice: Subject to any disclaimer, the term of this patent is extended or adjusted under 35 U.S.C. 154(b) by 124 days.

(21) Appl. No.: 11/533,038

(22) Filed: Sep. 19, 2006

(65) Prior Publication Data

US 2008/0129402 A1   Jun. 5, 2008

(51) Int. Cl.
*H03L 7/095* (2006.01)
*H03L 7/099* (2006.01)

(52) U.S. Cl. .................... 331/17; 331/25; 331/DIG. 2

(58) Field of Classification Search .............. 331/1 A, 331/4, 8, 10–11, 14, 16–18, 25, 179, DIG. 2; 327/156–159; 332/127; 360/51; 375/376; 455/260

See application file for complete search history.

(56) References Cited

U.S. PATENT DOCUMENTS 6,952,124 B2 * 10/2005 Pham ....................... 327/156

* cited by examiner

*Primary Examiner*—David Mis
(74) *Attorney, Agent, or Firm*—Winston Hsu

(57) ABSTRACT

An automatic switching phase-locked loop (PLL) is disclosed, including a phase detector, a charge pump generating a pump current, a band selector receiving a control voltage to produce a band selection signal and a voltage setting signal based the control voltage, a loop filter generating the control voltage corresponding to the pump current and setting the control voltage based on the voltage setting signal, and a multi-band voltage control oscillator (VCO) coupled to the control voltage and the band selection signal, selecting one of a plurality of operating bands based on the band selection signal, and providing an output signal of a frequency within the selected operating band based on the control voltage.

7 Claims, 10 Drawing Sheets

AUTOMATIC SWITCHING PHASE-LOCKED LOOP

BACKGROUND OF THE INVENTION

1. Field of the Invention

The invention relates to a phase-locked loop (PLL), and in particular to a phase-locked loop utilizing multi-band voltage control oscillator (VCO).

2. Description of the Related Art

A VCO requires capability to tune or adjust frequency over a range sufficient to cover a specified range of operating frequencies under expected worst-case conditions. A common use of a VCO is within a phase-locked loop (PLL). Depending on the application for which the PLL will be used, the specified operating frequency range may be a single frequency or a range of frequencies. The worst-case conditions may result from different supply voltages, variations in manufacturing process, component tolerances, and so on.

Conventionally, most PLLs employ a single-band VCO that provides a single range of frequencies (or operating band). For a conventional PLL with a single-band VCO, the tuning range of the VCO needs to cover the specified operating frequency range under the expected worst-case conditions. The gain of the VCO may thus be relatively large in order to obtain a large tuning range. However, a large VCO gain is typically undesirable for sensitivity to noise and degraded jitter performance of PLL.

A multi-band VCO provides multiple ranges of frequencies (or multiple operating bands) that collectively represent the overall tuning range of the VCO. By dividing the tuning range into multiple overlapping operating bands, the VCO gain may be reduced since the full range of the control signal corresponds to a smaller range of frequencies for one operating band. The smaller VCO gain of the multi-band VCO may then ameliorate many of the disadvantages of the single-band VCO.

Because a multi-band VCO can operate in any of the multiple operating bands, the proper operating band needs to be selected for use at any given moment. Thus, a PLL utilizing a multi-band VCO and having an automatic switching mechanism to properly switch the operating bands of the multi-band VCO is desirable.

BRIEF SUMMARY OF THE INVENTION

In a first embodiment of the invention, an automatic switching phase-locked loop (PLL) comprises a phase detector having a first input receiving a reference signal and a second input, and outputting a phase detection signal corresponding to the phase difference between the reference signal and a feedback signal received from the second input, a charge pump receiving the phase detection signal and producing a pump current according to the phase detection signal, a band selector receiving a control voltage to produce a band selection signal and a voltage setting signal based the control voltage, a loop filter generating the control voltage corresponding to the pump current and setting the control voltage based on the voltage setting signal, and a multi-band voltage control oscillator (VCO) coupled to the control voltage and the band selection signal, selecting one of a plurality of operating bands based on the band selection signal, and providing an output signal coupled to the second input of the phase detector. The output signal has a frequency within the selected operating band determined by the control voltage.

The band selector detects if the control voltage falls in a reference voltage range, and if so, the band selector produces neither the band selection signal to switch the operating band of the multi-band VCO nor the voltage setting signal to set the control voltage, or otherwise, produces the band selection signal to switch the operating band of the multi-band VCO and the voltage setting signal to set the control voltage.

Another automatic switching phase-locked loop is disclosed in accordance with a second embodiment of the invention, differing from the automatic switching phase-locked loop in the first embodiment only in the addition of a lock detector to detect whether the automatic switching PLL is locked, outputting a lock signal corresponding to the detection result and the band selector producing the band selection signal and the voltage setting signal based on further the lock signal.

The band selector detects if the control voltage falls in a reference voltage range or one of at least one additional reference voltage range adjacent to the reference voltage range. If the control voltage falls in the reference voltage range, the band selector produces neither the band selection signal to switch the operating band of the multi-band VCO nor the voltage setting signal to direct the loop filter to set the control voltage. If the control voltage falls in one of the additional reference voltage ranges, the band selector produces neither the band selection signal nor the voltage setting signal until receipt of lock signal corresponding to a locked status of the automatic switching PLL. If the control voltage does not fall in the first reference voltage range nor one of the additional reference voltage ranges, the band selector produces the band selection signal to switch the operating band of the multi-band VCO and the voltage setting signal to direct the loop filter to set the control voltage.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
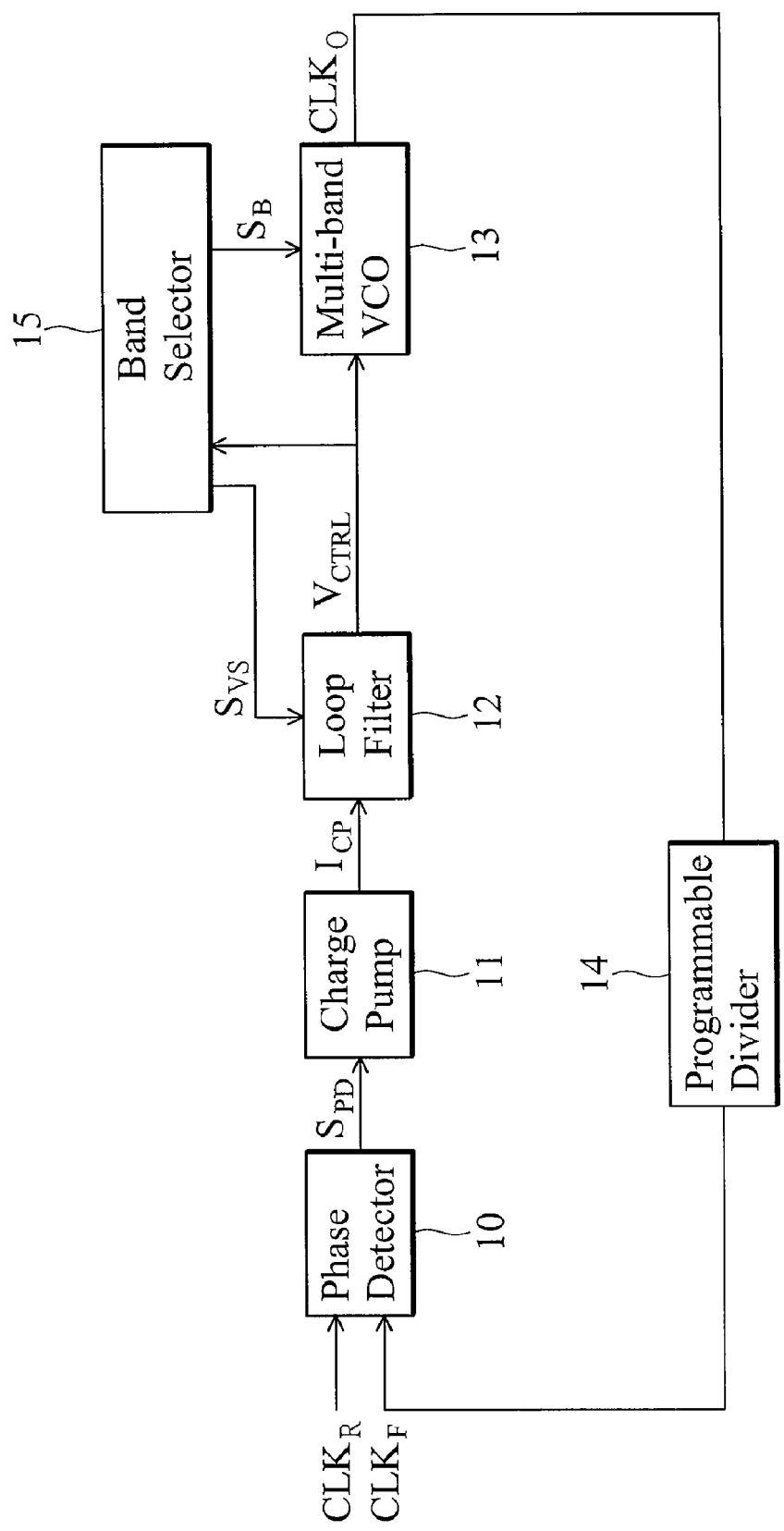
FIG. 1 is a block diagram of an automatic switching PLL 100 utilizing a multi-band VCO in accordance with an embodiment of the invention.

FIG. 1 is a block diagram of an automatic switching PLL 100 utilizing a multi-band VCO in accordance with an embodiment of the invention. As shown, the automatic switching PLL 100 comprises a phase detector 10, a charge pump 11, a loop filter 12, a multi-band voltage control oscillator (VCO) 13, a programmable divider 14 and a band selector 15.

The phase detector 10 receives a reference signal $CLK_R$ and an input signal $CLK_I$, detects the instantaneous phase therebetween, and provides the charge pump 11 with a phase detection signal $S_{PD}$ corresponding to the detected phase difference. The charge pump 11 produces a pump current $I_{CP}$ whose turning-on time is dependent on the phase difference indicated by the phase detection signal $S_{PD}$ and sends the pump current $I_{CP}$ to the loop filter 12. The loop filter 12 then produces a control voltage $V_{CTRL}$ corresponding to the pump current $I_{CP}$. The loop filter 12 sets the control voltage to one of a least one predetermined value when receiving a voltage setting signal $S_{VS}$ from the band selector 15.

The multi-band VCO 13 has multiple (N) operating bands, each of which covers a respective rage of frequencies. The multi-band VCO 13 selects one of the multiple operating bands based on a band selection signal $S_B$ received from the band selector 15 and then operates in the selected operating band. The multi-band VCO 13 is coupled to the control voltage $V_{CTRL}$ from the loop filter 12, and outputs an output signal $CLK_O$ of a frequency within the respective frequency range of the selected band and determined by the control voltage $V_{CTRL}$. The output signal $CLK_O$ is divided by a programmable divider 14 into the feedback signal $CLK_F$ and provided to the phase detector 10. It is noted that programmable divider 14 can be optionally removed and the output signal $CLK_O$ serve as the feedback signal $CLK_F$, as is well known in the art.

Figure 2A:
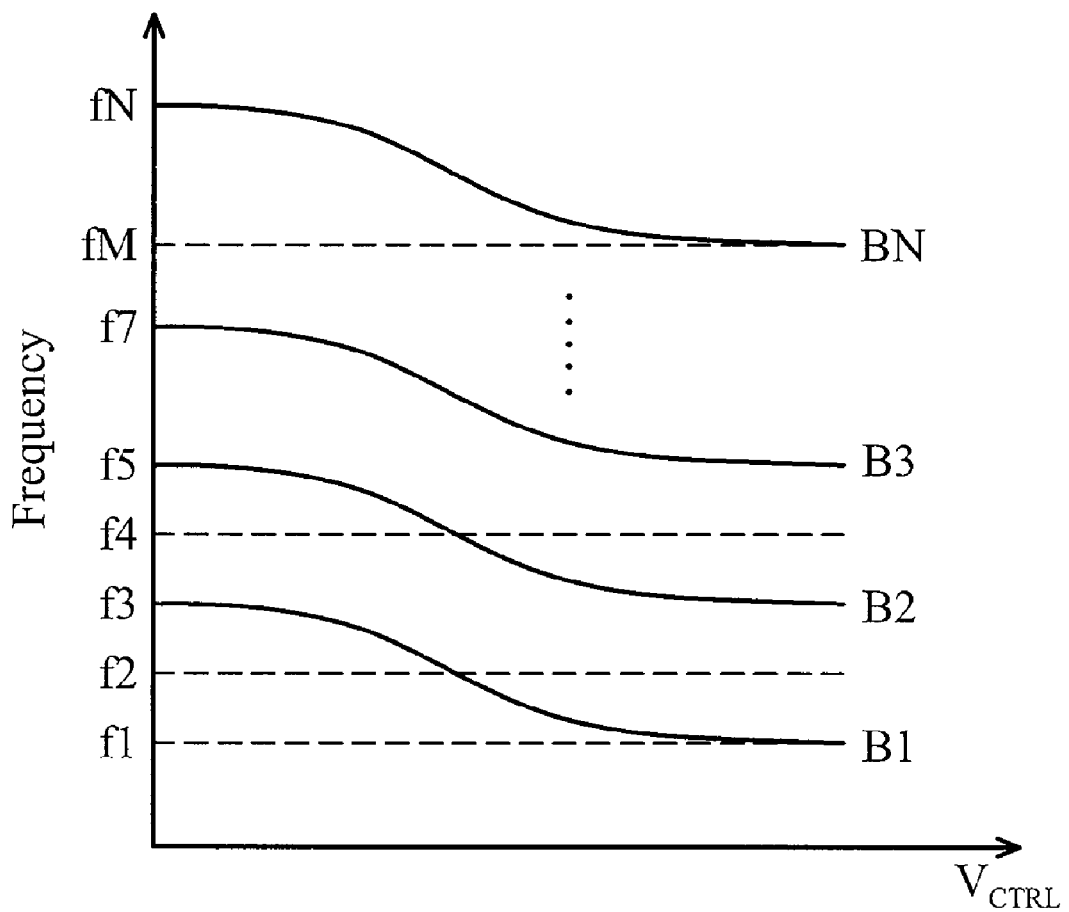
FIGS. 2A and 2B are exemplary diagrams of VCO gain transfer functions of a typical multi-band VCO.
Figure 2B:
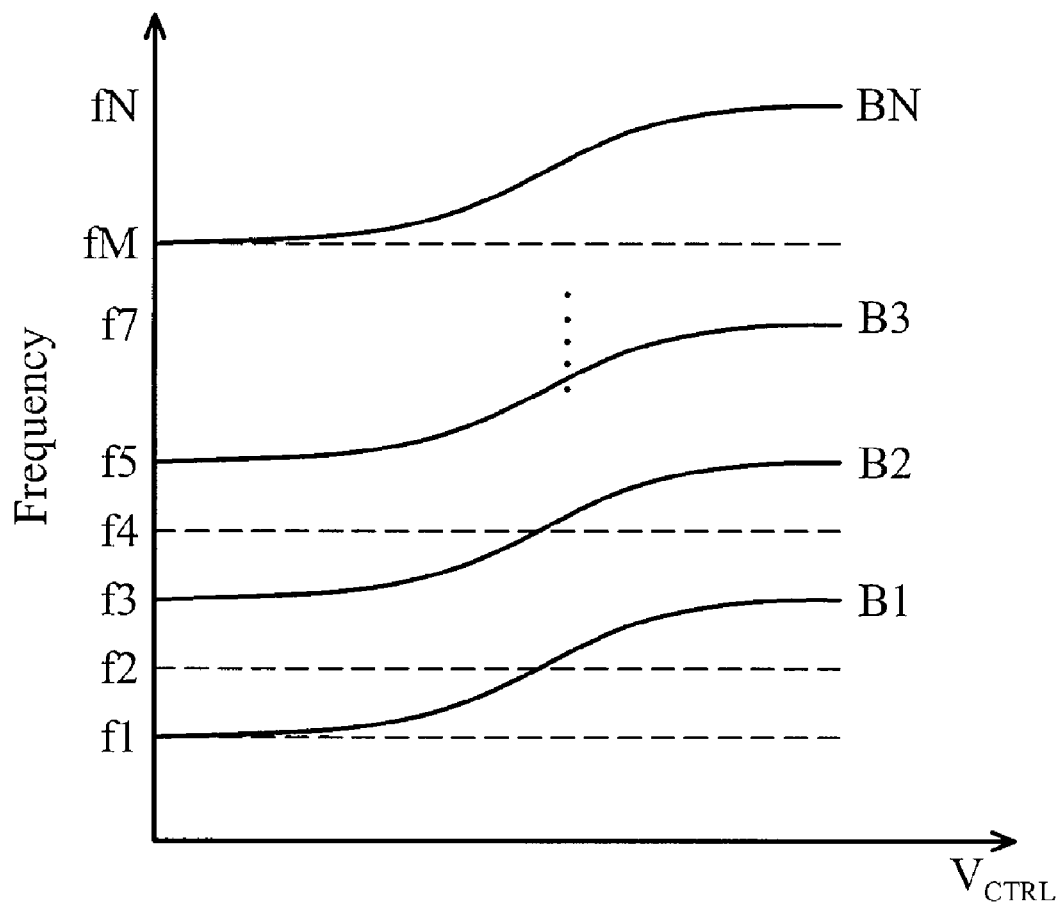

FIGS. 2A and 2B are exemplary diagrams of VCO gain transfer functions of a typical multi-band VCO, illustrating a frequency variation of the output signal $CLK_O$ with the control voltage $V_{CTRL}$ for the multi-band VCO 13. First referring to FIG. 2A, the multi-band VCO 13 have multiple operating bands B1-BN, each associated with a respective VCO gain transfer function. Operating band B1 covers a frequency range from f1 to f3, operating band B2 covers a frequency range from f3 to f5, and so on, and the operating band BN covers a frequency range from fM to fN. The multi-band VCO 13 thus has an overall turning range from the lowest frequency f1 to the highest frequency fN. The multi-band VCO 13 selects one among the operating band B1-BN based on the band selection signal $S_B$, and outputs the output signal $CLK_O$ of a frequency within the respective frequency range of the selected band and determined by the control voltage $V_{CTRL}$. FIG. 2B differs from FIG. 2A only in that the frequency of the output signal $CLK_O$ increases rather than decreases with the control voltage $V_{CTRL}$.

The band selector 15 is employed to provide both the band selection signal $S_B$ to switch the operating band of the multi-band VCO 13 and the voltage setting signal $S_{VS}$ to direct the loop filter 12 to set the control voltage $V_{CTRL}$ to one of the predetermined value. In the invention, the band selector 15 produces the band selection signal $S_B$ and the voltage setting signal $S_{VS}$ according the control voltage $V_{CTRL}$ provided by the loop filter 12. When the band selector 15 produces the band selection signal $S_B$ to switch the operating band of the multi-band VCO, it simultaneously produces the voltage setting signal $S_{VS}$ to direct the loop filter 12 to set the control voltage $V_{CTRL}$ to one of the at least one predetermined value.

In an embodiment of the invention, the band selector 15 detects if the control voltage $V_{CTRL}$ falls in a reference voltage range to determine whether to generate the band selection signal $S_B$ to switch the operating band of the multi-band VCO 13 and the voltage setting signal $S_{VS}$ to direct the loop filter 12 to set the control voltage $V_{CTRL}$. If the control voltage $V_{CTRL}$ falls beyond the reference voltage range, the band selector 15 then produces the band selection signal $S_B$ and the voltage setting signal $S_{VS}$. Otherwise, the band selector 15 produces neither the band selection signal $S_B$ nor the voltage setting signal $S_{VS}$.

Figure 3:
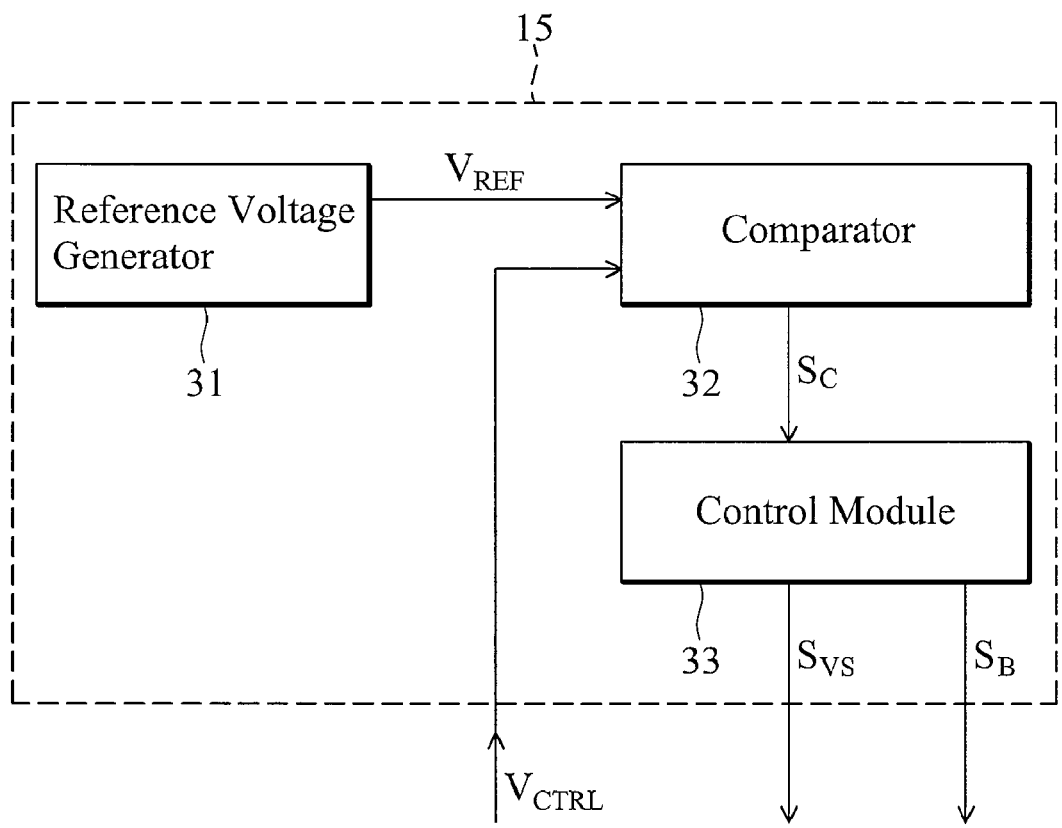
FIG. 3 is a block diagram of the band selector of FIG. 1.

FIG. 3 is a block diagram of the band selector 15 of FIG. 1 in accordance with an embodiment of the invention. As shown, in the band selector 15, a reference voltage generator 31 generates at least one reference voltage $V_{REF}$ corresponding to a reference voltage range and provides the at least one reference voltage $V_{REF}$ to a comparator 32. The comparator 32 then compares the control voltage $V_{CTRL}$ to the at least one reference voltage $V_{REF}$ to detect if the control voltage $V_{CTRL}$ falls in the reference voltage range and generates a comparison signal $S_C$ corresponding to the comparison result. The comparator 32 then provides the comparison signal $S_C$ to a control module 33, such that the control module 33 produces a band selection signal $S_B$ and a voltage setting signal $S_{VS}$ based on the comparison signal $S_C$. If the control voltage $V_{CTRL}$ falls beyond the reference voltage range, the control module 33 then produces the band selection signal $S_B$ to switch the operating band of the multi-band VCO 13 and the voltage setting signal $S_{VS}$ to direct the loop filter 12 to set the control voltage $V_{CTRL}$ to one of at least one predetermined value. Otherwise, it produces neither the band selection signal $S_B$ to switch the operating band of the multi-band VCO nor the voltage setting signal $S_{VS}$ to direct the loop filter 12 to set the control voltage $V_{CTRL}$. In one embodiment, when the control module 33 produces the band selection signal $S_B$ and voltage setting singal $S_{VS}$, it determines to which operating bands to switch and to which of the at least one predetermined value the control voltage $V_{CTRL}$ to set.

Figure 4A:
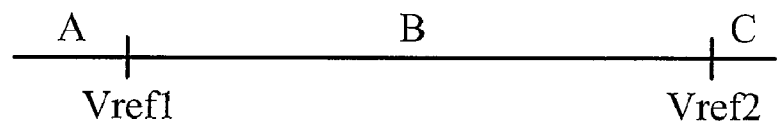
FIGS. 4A and 4B-4C are graphs respectively showing the reference voltage and corresponding switching mechanisms of operating bands of the multi-band VCO shown in FIGS. 2A-2B in accordance with an embodiment of the invention.
Figure 4B:
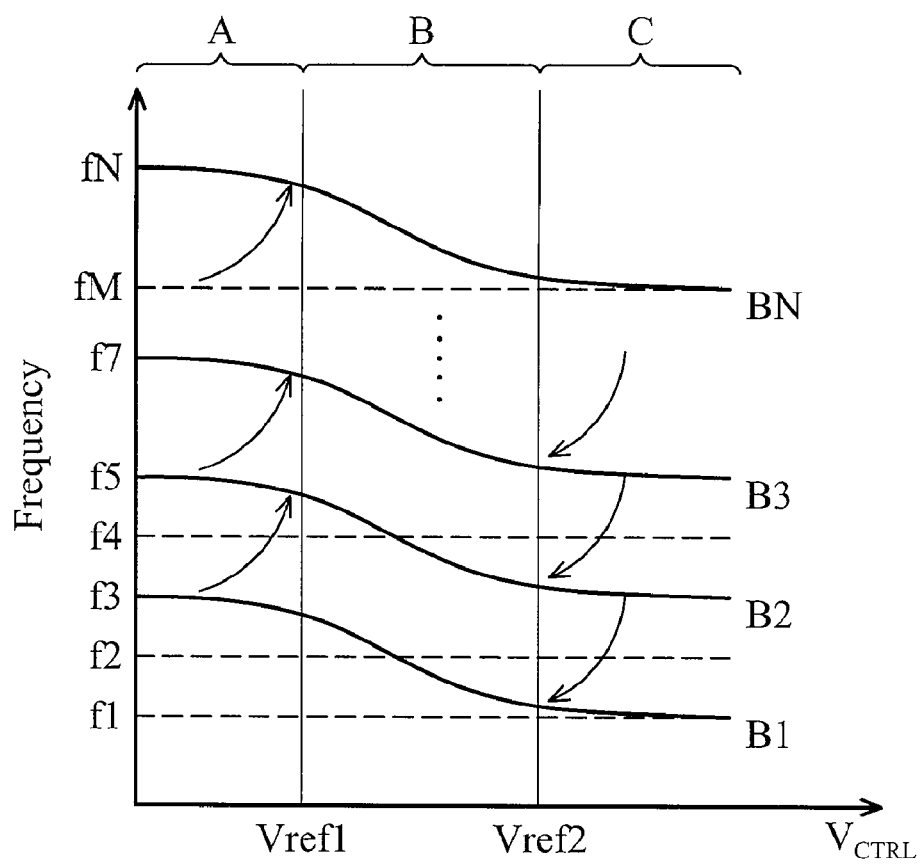
Figure 4C:
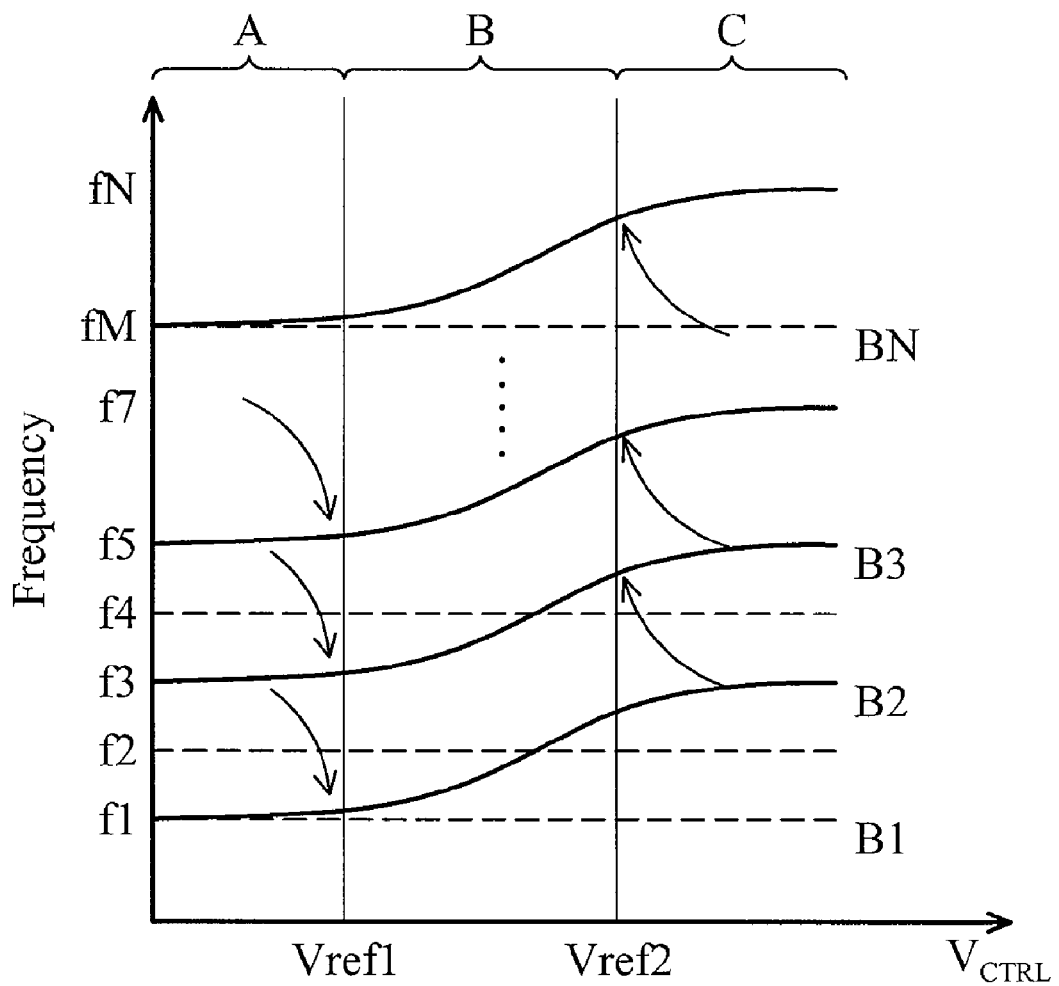

FIGS. 4A and 4B-4C are graphs respectively showing the reference voltage $V_{REF}$ and corresponding switching mechanisms of operating bands of the multi-band VCO shown in FIGS. 2B-2C in accordance with an embodiment of the invention. In FIG. 4A, the reference voltage $V_{REF}$ comprises first and second reference voltages Vref1 and Vref2. The comparator 32 compares the control voltage $V_{CTRL}$ to the first and second reference voltages Vref1 and Vref2 to decide in which of the voltage regions A, B or C the control voltage $V_{CTRL}$ falls and delivers information about the comparison result to the control module 33 via the comparison signal $S_C$. Referring to FIG. 4B, if the control voltage $V_{CTRL}$ falls in region A, the control module 33 produces the band selection signal $S_B$ to switch the multi-band VCO 13 to the next higher operating band. Meanwhile, the control module 33 further outputs the voltage setting signal $S_{VS}$ to direct the loop filter 12 to pull up the control voltage $V_{CTRL}$ of the multi-band VCO 13 to a first predetermined value. Similarly, if the control voltage $V_{CTRL}$ falls in region C, the control module 33 produces the band selection signal $S_B$ to switch the multi-band VCO 13 to the next lower operating band, and simultaneously outputs the voltage setting signal $S_{VS}$ to direct the loop filter 12 to pull down the control voltage $V_{CTRL}$ of the multi-band VCO 13 to a second predetermined value. However, if the control voltage $V_{CTRL}$ falls in region B, the control module 33 produces neither the band selection signal $S_B$ to switch the operating band of the multi-band VCO 13 nor the voltage setting signal $S_{VS}$ to direct the loop filter 12 to set the control voltage $V_{CTRL}$. In one embodiment, the first and second predetermined values are respectively the values of the first and second reference voltages Vref1 and Vref2. FIG. 4C differs from FIG. 4B only in that if the control voltage $V_{CTRL}$ falls in region A, the control module 33 produces the band selection signal $S_B$ to switch the multi-band VCO 13 to the next lower rather than higher operating band, and if the control voltage $V_{CTRL}$ falls in region C, the control module 33 produces the band selection signal $S_B$ to switch the multi-band VCO 13 to the next higher rather than lower operating band. Detailed description of FIG. 4C is thus ignored for brevity.

Figure 5:
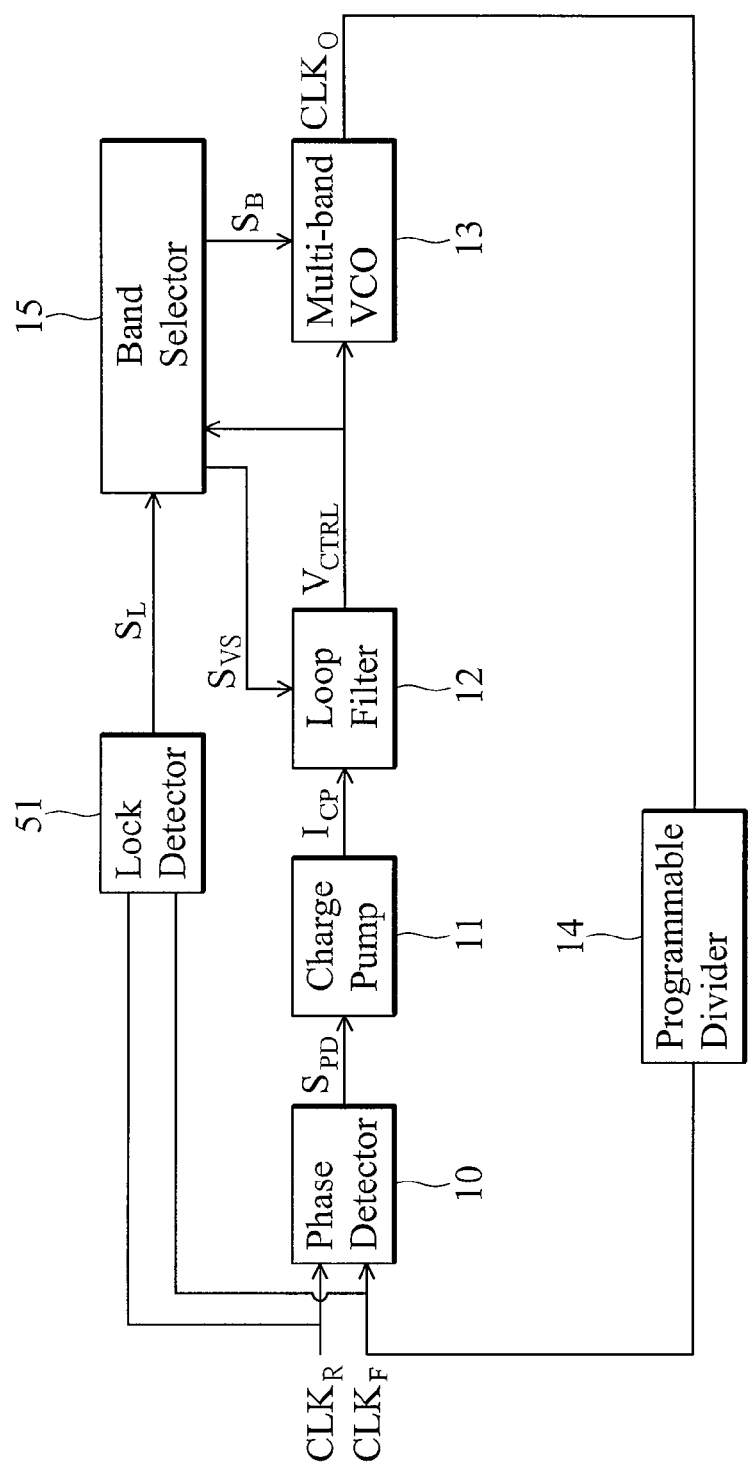
FIG. 5 is a block diagram of an automatic switching PLL in accordance with another embodiment of the invention.

FIG. 5 is a block diagram of an automatic switching PLL 500 in accordance with another embodiment of the invention, differing from the automatic switching PLL 100 in FIG. 1 only in addition of a lock detector 51. The lock detector 51 receives the reference signal $CLK_R$ and the feedback signal $CLK_F$ to detect whether the PLL 500 is locked and transfers a lock signal $S_L$ corresponding the detection result to the band selector 12. The band selector 12 receives the lock signal $S_L$ in addition to the control voltage $V_{CTRL}$, and produces the band selection signal $S_B$ and the voltage setting signal $S_{VS}$ based on not only the control voltage $V_{CTRL}$ but also the lock signal $S_L$. It is noted that the connections of the lock detector 51 with the other blocks in FIG. 5 are shown only as an example. For example, the lock detector 51 may receive only the output signal $S_O$ to detect whether the PLL 500 is locked.

Figure 6:
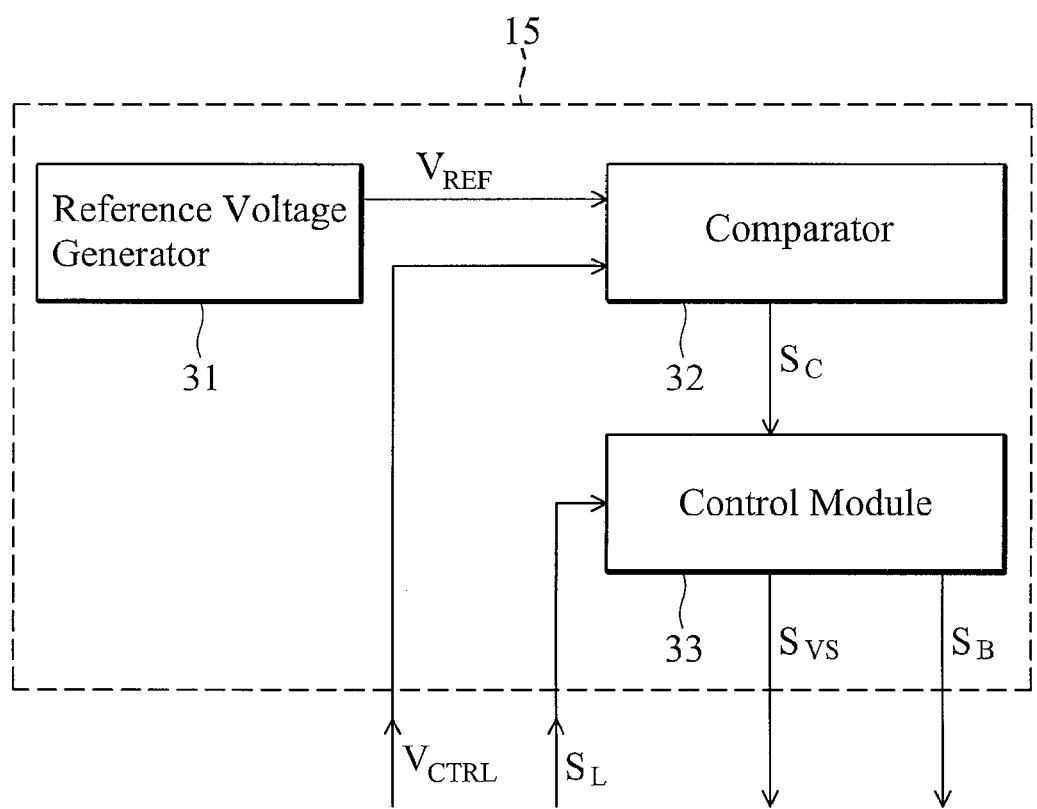
FIG. 6 is a block diagram of the band selector of FIG. 5.

FIG. 6 is a block diagram of the band selector 15 of FIG. 5 in accordance with an embodiment of the invention, differing from that of FIG. 3 in only that the control module 33 receives the lock signal $S_L$ in addition to the comparison signal $S_C$ and outputs the band selection signal $S_B$ and the voltage setting signal $S_{VS}$ according to the lock signal $S_L$ in addition to the comparison signal $S_C$. Details of the blocks are not repeated for brevity.

In this embodiment, the reference voltage generator 31 generates at least one reference voltage $V_{REF}$ corresponding to a reference voltage range and at least one additional reference voltage range adjacent to the reference voltage range, and provides the at least one reference voltage $V_{REF}$ to the comparator 32. The comparator 32 then compares the control voltage $V_{CTRL}$ to the at least one reference voltage $V_{REF}$ to detect if the control voltage $V_{CTRL}$ falls in the reference voltage range or one of the at least one additional reference voltage ranges and then generates a comparison signal $S_C$ corresponding to the comparison result. The comparison signal $S_C$ is provided to the control module 33. The control module 33 receives the comparison signal $S_C$ and outputs the band selection signal $S_B$ and the voltage setting signal $S_{VS}$ according to the comparison signal $S_C$ and the lock signal $S_L$. Similar to descriptions on FIG. 4, if the comparison signal $S_C$ indicates that the control voltage $V_{CTRL}$ falls beyond the reference voltage range, the control module 33 produces the band selection signal $S_B$ to switch the operating band of the multi-band VCO 13 and the voltage setting signal $S_{VS}$ to direct the loop filter 12 to set the control voltage $V_{CTRL}$ to one of at least one predetermined value. Otherwise, the control module 33 produces neither the band selection signal $S_B$ to switch the operating band of the multi-band VCO 13 nor the voltage setting signal $S_{VS}$ to direct the loop filter 12 to set the control voltage $V_{CTRL}$. However, there is something different between the embodiments of FIGS. 6 and 3. In the embodiment, two situations are distinguished when the control voltage falls beyond the reference voltage range. In the first situation, the control voltage $V_{CTRL}$ falls in one of the at least one additional reference voltage ranges. In this situation, the control module 33 further refers to the lock signal $S_L$ to check if the automatic switching phase-locked loop 600 is locked or not. The control module 33 produces neither the band selection signal $S_B$ nor the voltage setting signal $S_{VS}$ until it receives the lock signal $S_L$ corresponding to a locked status of the automatic switching PLL. In the second situation, the control voltage $V_{CTRL}$ falls in none of the at least one additional reference voltage range. In this situation, the control module 33 produces the band selection signal $S_B$ and the voltage setting signal $S_{VS}$ immediately without checking the lock signal $S_L$. In the embodiment, whether in the first or second situation, the control module 33 may make the determination of which operating bands to switch and which of the at least one predetermined value the control voltage $V_{CTRL}$ to set.

Figure 7A:
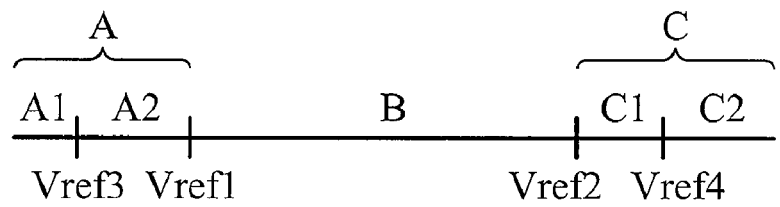
FIGS. 7A and 7B-7C are graphs respectively showing the reference voltage and corresponding switching mechanisms of operating bands of the multi-band VCO shown in FIGS. 2A-2B in accordance with another embodiment of the invention.
Figure 7B:
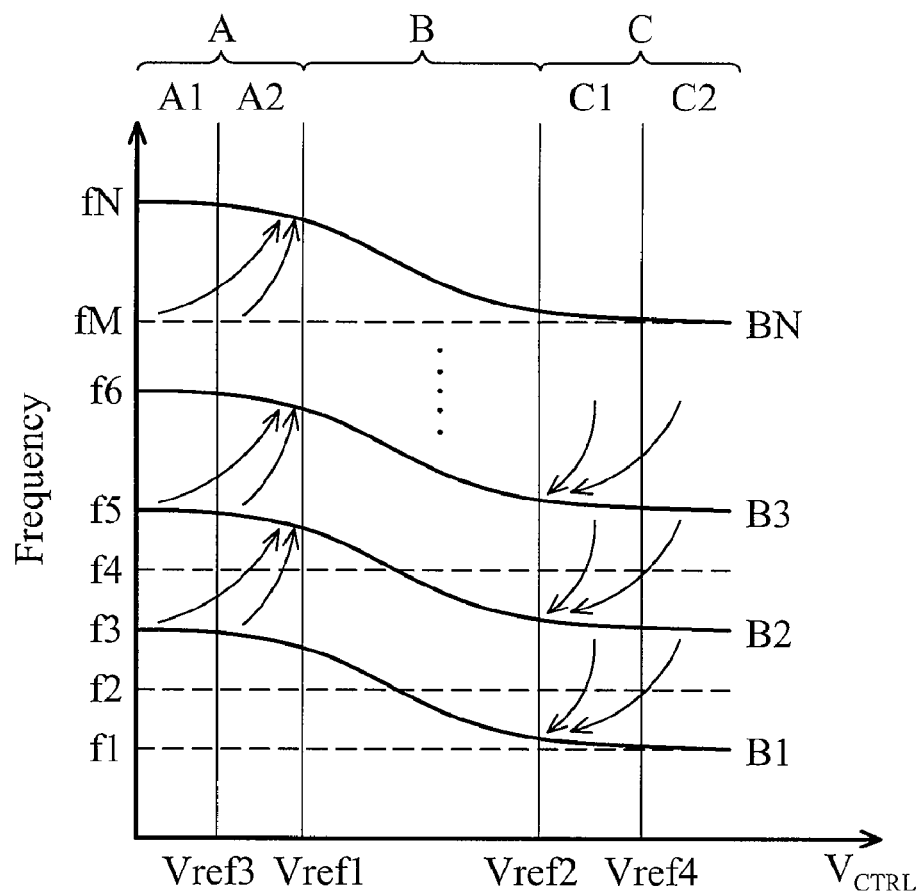
Figure 7C:
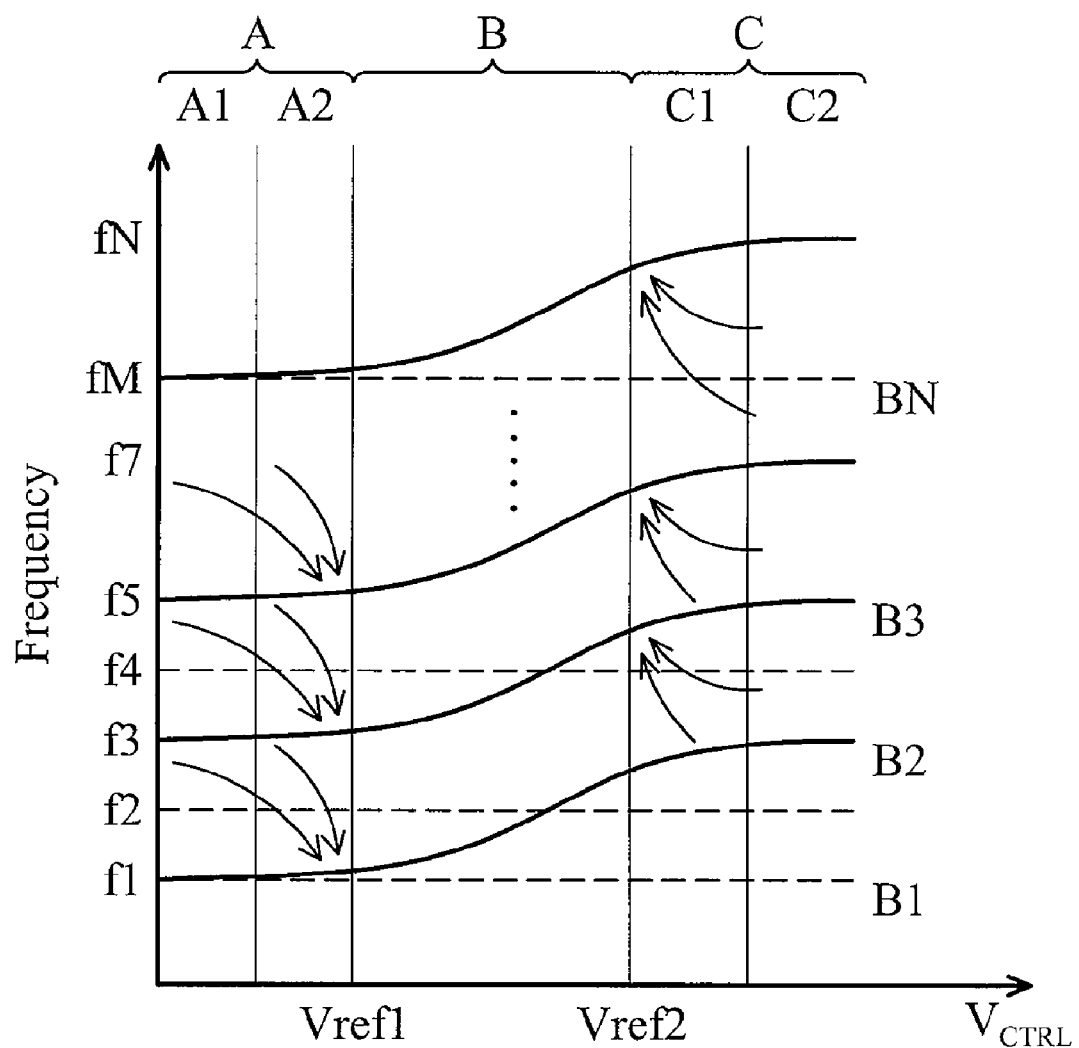

FIGS. 7A and 7B-C are graphs respectively showing the reference voltage $V_{REF}$ and corresponding switching mechanism of operating bands of the multi-band VCO shown in FIG. 2A-2B in accordance with another embodiment of the invention. FIG. 7A differs from FIG. 4A only in that the voltage region A is divided into two sub-regions A1 and A2 by a third reference voltage Vref3, and similarly, the voltage region C is divided into two sub-regions C1 and C2 by a fourth reference voltage Vref4. This means that the reference voltage generator 31 generates the at least one reference voltage Vref1-Vref4, wherein the voltage range B between reference voltages Vref1 and Vref2 acts as the reference voltage range, and both the sub-voltage ranges A2 and C1 respectively between reference voltages VreB and Vref1, and Vref2 and Vref4 act as the additional voltage ranges.

The comparator 32 hence compares the control voltage $V_{CTRL}$ to the first to fourth reference voltages Vref1-Vref4 to decide in which of the voltage regions A1, A2, B, C1 and C2 the control voltage $V_{CTRL}$ falls and delivers information about the comparison result to the control module 33 via the comparison signal $S_C$. As shown in FIG. 7B, similar to FIG. 4B, if the control voltage $V_{CTRL}$ falls in the voltage region B, the control module 33 produces neither the band selection signal $S_B$ to switch the operating band of the multi-band VCO 13 nor the voltage setting signal $S_{VS}$ to direct the loop filter 12 to set the control voltage $V_{CTRL}$.

And also similarly, if the control module 33 receives the comparison signal $S_C$ indicating that the control voltage $V_{CTRL}$ falls in the voltage regions A and C, it produces the band selection signal $S_B$ to respectively switch the multi-band VCO 13 to the next higher and lower operating band and outputs the voltage setting signal $S_{VS}$ to direct the loop filter 12 to respectively pull up and pull down the control voltage $V_{CTRL}$ to first and second predetermined values. In one embodiment, the first and second predetermined values are the values of the first and second reference voltages Vref1 and Vref2 respectively. However, the difference between FIGS. 7B and 4B is that if the control voltage $V_{CTRL}$ falls in the sub-voltage region A2 or C1 within the voltage regions A or C respectively, the control module 33 produces neither the band selection signal $S_B$ nor the voltage setting signal $S_{VS}$ until it receives the lock signal $S_L$ corresponding to a locked status of the automatic switching PLL.

More specifically, if the control module 33 receives the comparison signal $S_C$ indicating that the control voltage $V_{CTRL}$ falls in the voltage regions A1 and C2, it generates the band selection signal $S_B$ to respectively switch the multi-band VCO 13 to the next higher and lower operating band and output the voltage setting signal $S_{VS}$ to direct the loop filter 12 to pull up and down the control voltage $V_{CTRL}$. However, if the control module 33 receives the comparison signal $S_C$ indicating that the control voltage $V_{CTRL}$ falls in the voltage regions A2 and C1, it further checks the lock signal $S_L$ to detect whether the automatic switching PLL 500 is locked. If the lock signal $S_L$ indicates the automatic switching PLL 500 is locked, the control module 33 then generates the band selection signal $S_B$ to respectively switch the multi-band VCO 13 to the next higher and lower operating band and output the voltage setting signal $S_{VS}$ to direct the loop filter 12 to pull up and down the control voltage $V_{CTRL}$. Otherwise, it produces neither the band selection signal $S_B$ nor the voltage setting signal $S_{VS}$ and the multi-band VCO 13 thus operates in the current operating band until the automatic PLL is locked.

Similarly, the difference between FIGS. 7C and 4C is that if the control voltage $V_{CTRL}$ falls in the sub-voltage region A2 or C1 within the voltage regions A or C respectively, the control module 33 produces neither the band selection signal $S_B$ nor the voltage setting signal $S_{VS}$ until it receives the lock signal $S_L$ corresponding to a locked status of the automatic switching PLL. FIG. 7C differs from FIG. 7B only in that if the control voltage $V_{CTRL}$ falls in region A, the control module 33 produces the band selection signal $S_B$ to switch the multi-band VCO 13 to the next lower rather than higher operating band, and if the control voltage $V_{CTRL}$ falls in region C, the control module 33 produces the band selection signal $S_B$ to switch the multi-band VCO 13 to the next higher rather than lower operating band. Detailed description of FIG. 7C is thus ignored for brevity.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An automatic switching phase-locked loop (PLL), comprising:
    a phase detector receiving a reference signal and a feedback signal, and outputting a phase detection signal corresponding to the phase difference between the reference signal and the feedback signal;
    a charge pump receiving the phase detection signal and producing a pump current according to the phase detection signal;
    a band selector receiving a control voltage, producing a band selection signal and a voltage setting signal based the control voltage;
    a loop filter generating the control voltage corresponding to the pump current and setting the control voltage based on the voltage setting signal;
    a multi-band voltage control oscillator (VCO) coupled to the control voltage and the band selection signal, selecting one of a plurality of operating bands based on the band selection signal, and providing an output signal of a frequency within the selected operating band based on the control voltage; and
    a lock detector detecting whether the automatic switching PLL is locked, and outputting a lock signal corresponding to the detection result,
    wherein the band selector detects if the control voltage falls in a reference voltage range, and if so, the band selector produces neither the band selection signal to switch the operating band of the multi-band VCO nor the voltage setting signal to set the control voltage, or otherwise, produces the band selection signal to switch the operating band of the multi-band VCO and the voltage setting signal to set the control voltage, and
    wherein the band selector further receives the lock signal and further detects if the control voltage falls in one of at least one additional reference voltage ranges adjacent to the reference voltage range, and when detecting the control voltage in one of the at least one additional reference voltage range, producing neither the band selection signal nor the voltage setting signal until receiving the lock signal corresponding to a locked status of the automatic switching PLL.

2. The automatic switching phase-locked loop of claim 1, wherein the band selector comprises:
    a reference voltage generator providing at least one reference voltage corresponding to the reference voltage range;
    a comparator comparing the control voltage to the at least one reference voltage to detect if the control voltage falls in the reference voltage range, and generating a comparison signal corresponding to the comparison result; and
    a control module receiving the comparison signal, producing neither the band selection signal to switch the operating band of the multi-band VCO nor the voltage setting signal if the comparison signal indicates that the control voltage falls in the reference voltage range, or otherwise, producing the band selection signal to switch the operating band of the multi-band VCO and the voltage setting signal to set the control voltage.

3. The automatic switching phase-locked loop of claim 2, wherein the reference voltage generator generates a first reference voltage and a second reference voltage higher than the first reference voltage;
    wherein the comparator compares the control voltage to the first and the second reference voltages to detect if the control voltage falls between the first and second reference voltages, and generating the comparison signal corresponding to the comparison result; and
    wherein the control module produces the band selection signal to switch the multi-band VCO to the next lower or higher operating band if the frequency of the output signal has an increasing or decreasing relationship with the control voltage respectively and produces the voltage setting signal to direct the loop filter to pull up the control voltage when receiving the comparison signal indicating that the control voltage falls below the first reference voltage;
    wherein the control module produces the band selection signal to switch the multi-band VCO to the next higher or lower operating band if the frequency of the output signal has an increasing or decreasing relationship with the control voltage respectively and produces the voltage setting signal to direct the loop filter to pull down the control voltage when receiving the comparison signal indicating that the control voltage falls beyond the second reference voltage; and
    wherein the control module produces neither the band selection signal to switch the operating band of the multi-band VCO nor the voltage setting signal when receiving the comparison signal indicating that the control voltage falls between the first and second reference voltages.

4. The automatic switching phase-locked loop of claim 3, wherein the control module produces the voltage setting signal to direct the loop filter to set the control voltage to the first and second reference voltages when receiving the comparison signal indicating that the control voltage falls below the first reference voltage and beyond the second reference voltage, respectively.

5. The automatic switching phase-locked loop of claim 1, further comprising:
    a lock detector detecting whether the automatic switching PLL is locked, and outputting a lock signal corresponding to the detection result; and
    wherein the band selector further receives the lock signal and produces the band selection signal and the voltage setting signal further based on the lock signal.

6. The automatic switching phase-locked loop of claim 3, further comprising:

a lock detector detecting whether the automatic switching PLL is locked, and outputting a lock signal corresponding to the detection result; and wherein the reference voltage generator further generates a third reference voltage below the first reference voltage and a fourth reference voltage beyond the second reference voltage;

wherein the comparator further compares the control voltage to the third and fourth reference voltages to detect if the control voltage falls between the third and first reference voltages or between the second and fourth reference voltages, and the comparison signal corresponds further to the further comparison result; and wherein the control module further receives the lock signal, and when receiving the comparison signal indicating that the control voltage falls between the third and first reference voltages or between the second and fourth reference voltage ranges, it generates neither the band selection signal nor the voltage setting signal until receipt of the locked signal indicating that the automatic switching PLL is locked.

7. The automatic switching phase-locked loop of claim 6, wherein the control module produces the voltage setting signal to direct the loop filter to set the control voltage to the first and second reference voltages when receiving the comparison signal indicating that the control voltage falls below the first reference voltage and falls beyond the second reference voltage.

\* \* \* \* \*